(12) United States Patent
Bernstein et al.

(10) Patent No.: US 9,075,106 B2
(45) Date of Patent: Jul. 7, 2015

(54) DETECTING CHIP ALTERATIONS WITH LIGHT EMISSION

(75) Inventors: Kerry Bernstein, Underhill, VT (US); James Culp, Newburgh, NY (US); David F. Heidel, Mahopac, NY (US); Dirk Pfeiffer, Croton-on-Hudson, NY (US); Anthony D. Polson, Jericho, VT (US); Peilin Song, Lagrangeville, NY (US); Franco Stellari, Waldwick, NJ (US); Robert L. Wisnieff, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 1390 days.

(21) Appl. No.: 12/512,168

(22) Filed: Jul. 30, 2009

(65) Prior Publication Data

US 2011/0026806 A1    Feb. 3, 2011

(51) Int. Cl.
*G06K 9/00* (2006.01)
*G01R 31/311* (2006.01)
*G01R 31/00* (2006.01)

(52) U.S. Cl.
CPC .................................. *G01R 31/311* (2013.01)

(58) Field of Classification Search
CPC ............ G01R 31/311; G01B 11/0675; G01B 2290/50; G01B 2290/70; G01N 21/8422; G03F 7/70625; B81C 1/00587
See application file for complete search history.

(56) References Cited

U.S. PATENT DOCUMENTS

| | | | |
|---|---|---|---|
| 4,839,588 A | 6/1989 | Jantsch et al. | |
| 5,406,209 A | 4/1995 | Johnson et al. | |
| 5,479,252 A * | 12/1995 | Worster et al. | 356/237.5 |
| 5,760,892 A | 6/1998 | Koyama | |
| 5,980,767 A * | 11/1999 | Koshimizu et al. | 216/60 |
| 6,248,988 B1 * | 6/2001 | Krantz | 250/201.3 |
| 6,442,720 B1 | 8/2002 | Koprowski et al. | |
| 6,553,546 B1 | 4/2003 | Murakami | |
| 6,553,646 B1 | 4/2003 | de Rochemont | |
| 6,995,564 B1 | 2/2006 | Ang et al. | |
| 7,089,513 B2 | 8/2006 | Bard et al. | |
| 7,113,630 B2 | 9/2006 | Dajee et al. | |
| 7,224,828 B2 | 5/2007 | Cotton et al. | |
| 7,400,154 B2 | 7/2008 | Desplats et al. | |

(Continued)

FOREIGN PATENT DOCUMENTS

EP    0 510 887 A2    10/1992
EP    0 510 887 B1    10/1992

(Continued)

OTHER PUBLICATIONS http://redwood.berkeley.edu/bruno/npb261/aliasing.pdf.*
Wei, et al., "Layer and Lateral-resolved Magnetization Studies Using Photoemission Electron Microscopy", Journal of Magnetism and Magnetic Materials, Elsevier Science vol. 28, pp. 49-52, (2004).
Knebel et al., Diagnosis and Characterization of Timing-Related Defects by Time-Dependent Light Emission, http://www2.computer.org/portal/web/csdl/doi/10.1109/TEST.1998.743254.

(Continued)

*Primary Examiner* — Florian Zeender
*Assistant Examiner* — Dana Amsdell
(74) *Attorney, Agent, or Firm* — Anne V. Dougherty; Ryan, Mason & Lewis, LLP

(57) ABSTRACT

An emission map of a circuit to be tested for alterations is obtained by measuring the physical circuit to be tested. An emission map of a reference circuit is obtained by measuring a physical reference circuit or by simulating the emissions expected from the reference circuit. The emission map of the circuit to be tested is compared with the emission map of the reference circuit, to determine presence of alterations in the circuit to be tested, as compared to the reference circuit.

19 Claims, 13 Drawing Sheets

(56) References Cited

U.S. PATENT DOCUMENTS

| | | | |
|---|---|---|---|
| 7,576,910 B2* | 8/2009 | Terada et al. | 359/383 |
| 8,115,170 B2* | 2/2012 | Stellari et al. | 250/339.06 |
| 2003/0098692 A1 | 5/2003 | Cotton et al. | |
| 2003/0210057 A1* | 11/2003 | Cotton et al. | 324/501 |
| 2004/0027149 A1 | 2/2004 | Aitren et al. | |
| 2006/0018514 A1* | 1/2006 | Bankhead | 382/108 |
| 2007/0081154 A1* | 4/2007 | Mapoles et al. | 356/237.5 |
| 2008/0024794 A1 | 1/2008 | Miyazaki et al. | |
| 2008/0266574 A1* | 10/2008 | Groot et al. | 356/511 |
| 2008/0286885 A1* | 11/2008 | Izikson et al. | 438/7 |
| 2009/0048801 A1* | 2/2009 | Chandra | 702/120 |
| 2009/0106714 A1 | 4/2009 | Culp et al. | |
| 2009/0150098 A1* | 6/2009 | Khurana | 702/58 |

FOREIGN PATENT DOCUMENTS

| | | |
|---|---|---|
| JP | 2001201545 | 7/2001 |
| JP | 2001203248 | 7/2001 |
| JP | 2008198913 | 8/2008 |

OTHER PUBLICATIONS

Stellari et al., U.S. Appl. No. 12/493,686, filed Jun. 29, 2009, titled Creating Emission Images of Integrated Circuits.

Boit et al., Physical Techniques for Chip-Backside IC Debug in Nanotechnologies, Silicon Debug and Diagnosis, 2008 IEEE, pp. 250-257.

Image Processing—Image and Video Processing, Analysis, Algorithm Development, and System Design, The MathWorks, http://www.mathworks.com/applications/imageprocessing/.

Hamamatsu, Inverted Emission Microscope iPHEMOS-SD, www.hamamatsu.com, pp. 1-2.

Math Software for Engineers, Educators & Students, Maplesoft, http://www.maplesoft.com.

Wolfram Mathematica7, http://www.wolfram.com/products/mathematica/index.html, 2009.

DCG Systems, Meridian, Spatial Fault and Defect Localization, http://www.dcgsystems.com/meridian-IV.html, pp. 1-4.

BSIM—Wikipedia, http://en.wikipedia.org/wiki/BSIM.

SPICE—Wikipedia, http://en.wikipedia.org/wiki/SPICE, pp. 1-5.

* cited by examiner

DETECTING CHIP ALTERATIONS WITH LIGHT EMISSION

FIELD OF THE INVENTION

The present invention relates to the electrical, electronic and computer arts, and, more particularly, to information technology (IT) management and the like.

BACKGROUND OF THE INVENTION

The development and fabrication of advanced integrated circuits (ICs) is often carried out by foundries, which may not always be trustworthy. In some instances, the manufactured chips may be modified as compared to the initial design (that is, tampered with) by adding "malicious circuitry" or deleting circuits that can open security issues and/or lead to reliability problems, controlled malfunctioning, and the like. Alterations may be introduced at the silicon manufacturing level, back end of the line wiring level, and/or at the packaging level. These "inserted" or "deleted" circuits cannot be detected through regular electrical screening tests, because they are designed to hide themselves from such tests.

SUMMARY OF THE INVENTION

Principles of the invention provide techniques for detecting chip alterations with light emission. In one aspect, an exemplary method includes the steps of obtaining an emission map of a circuit to be tested for alterations; obtaining an emission map of a reference circuit; and comparing the emission map of the circuit to be tested with the emission map of the reference circuit, to determine presence of the alterations.

One or more embodiments of the invention or elements thereof can be implemented in the form of a computer product including a computer readable storage medium with computer usable program code for performing the method steps indicated. Furthermore, one or more embodiments of the invention or elements thereof can be implemented in the form of an apparatus including a memory and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s), or (iii) a combination of hardware and software modules; any of (i)-(iii) implement the specific techniques set forth herein, and the software modules are stored in a computer-readable storage medium (or multiple such media).

One or more embodiments of the invention may offer one or more of the following technical benefits:
  effective, accurate, simple, and non-invasive detection of chip alterations
  faster than analyzing the entire chip using routine physical failure analysis methods, such as physical delayering, scanning electron microscope (SEM) inspections, transmission electron microscopy (TEM) cross section, and the like
  because of greater speed, can be applied to a large sample, or all, chips, and not merely a small batch
  non-destructive so chips to be used in the actual application can be tested, unlike destructive methods These and other features, aspects and advantages of the invention will become apparent from the following detailed description of illustrative embodiments thereof, which is to be read in connection with the accompanying drawings.

DETAILED DESCRIPTION OF PREFERRED EMBODIMENTS

Figure 1:
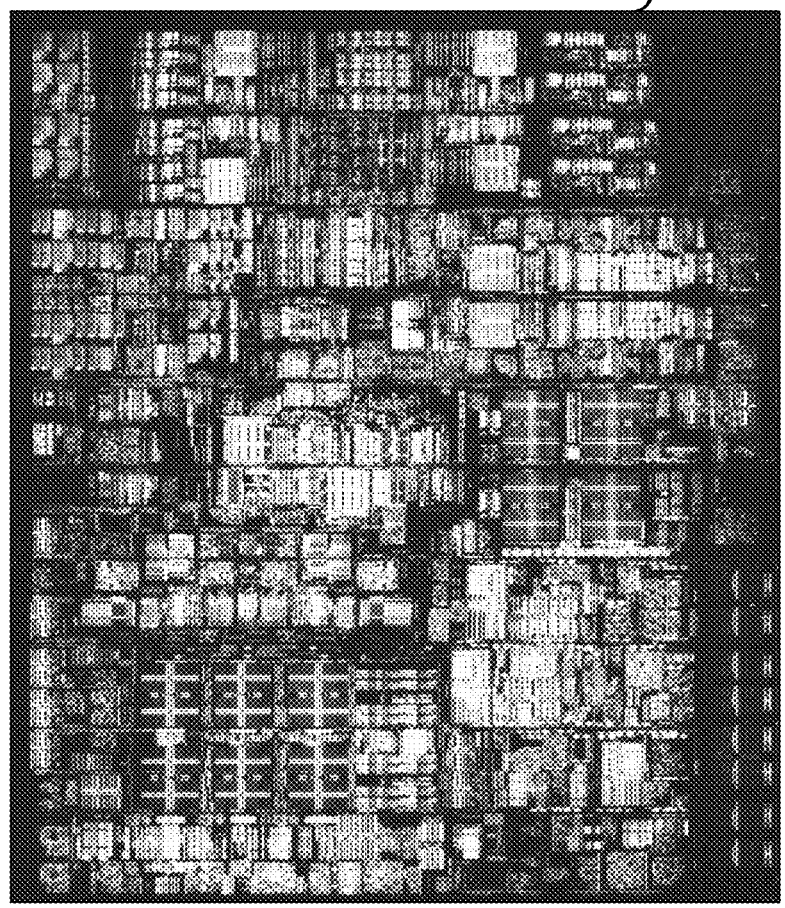
FIG. 1 presents a light emission image of an integrated circuit.

One or more embodiments of the invention make use of emission-based techniques and methods for diagnosing integrated circuits, such as time integrated emission from off-state leakage current or time-resolved emission from switching gates These methods are nondestructive. In one or more embodiments, these techniques are adapted to detect chip alterations using a new methodology set forth herein. Purely for purposes of illustration and not limitation, assume that the chip under test is flip-packaged and its backside is exposed for optical access. The intrinsic light emission from the power-activated circuits can be captured with highly sensitive imaging cameras in either a static or a dynamic fashion. FIG. 1 shows an example 100 of a time integrated emission image acquired with a 10× lens from an integrated circuit.

Figure 2:
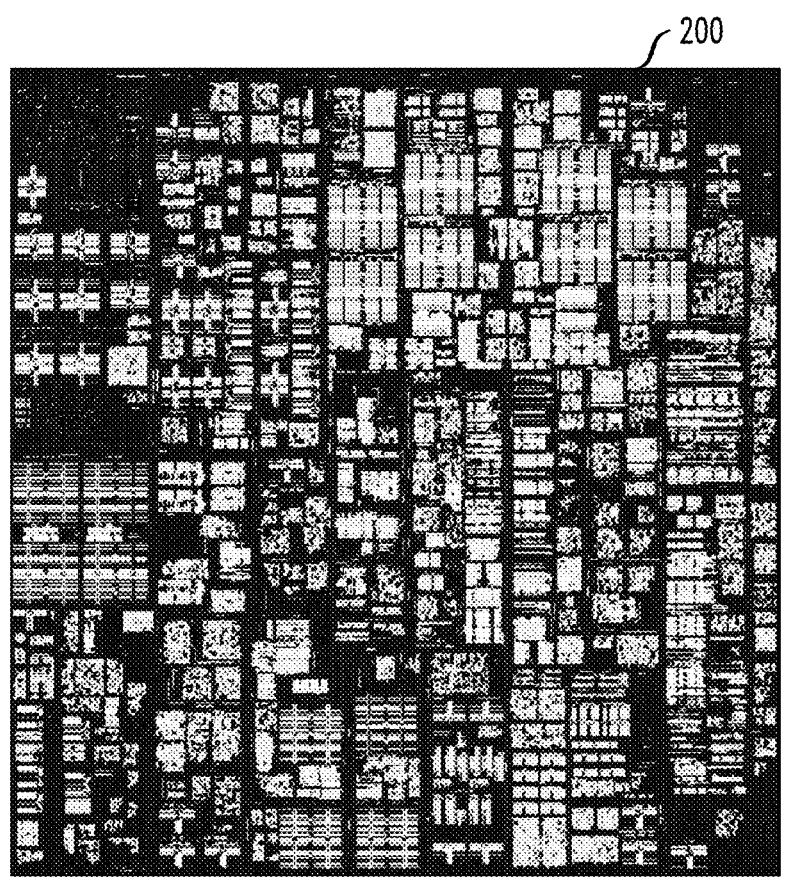
FIG. 2 presents a simulated light emission map.

One or more embodiments provide software tools that can generate simulated and/or predicted emission maps for a given design, based on simulation and using a model of the emission phenomena. Such a predicted emission map 200 is depicted in FIG. 2. In one or more embodiments, such a predicted emission map is employed to compare the measured chip light emission (measured from a real device under test) against the simulated chip light emission (created from the design data and emission model). Such an approach is particularly advantageous where no "golden" chip is available. A "golden" chip refers to a chip known to conform to the desired design and not to contain any malicious circuitry.

Figure 3:
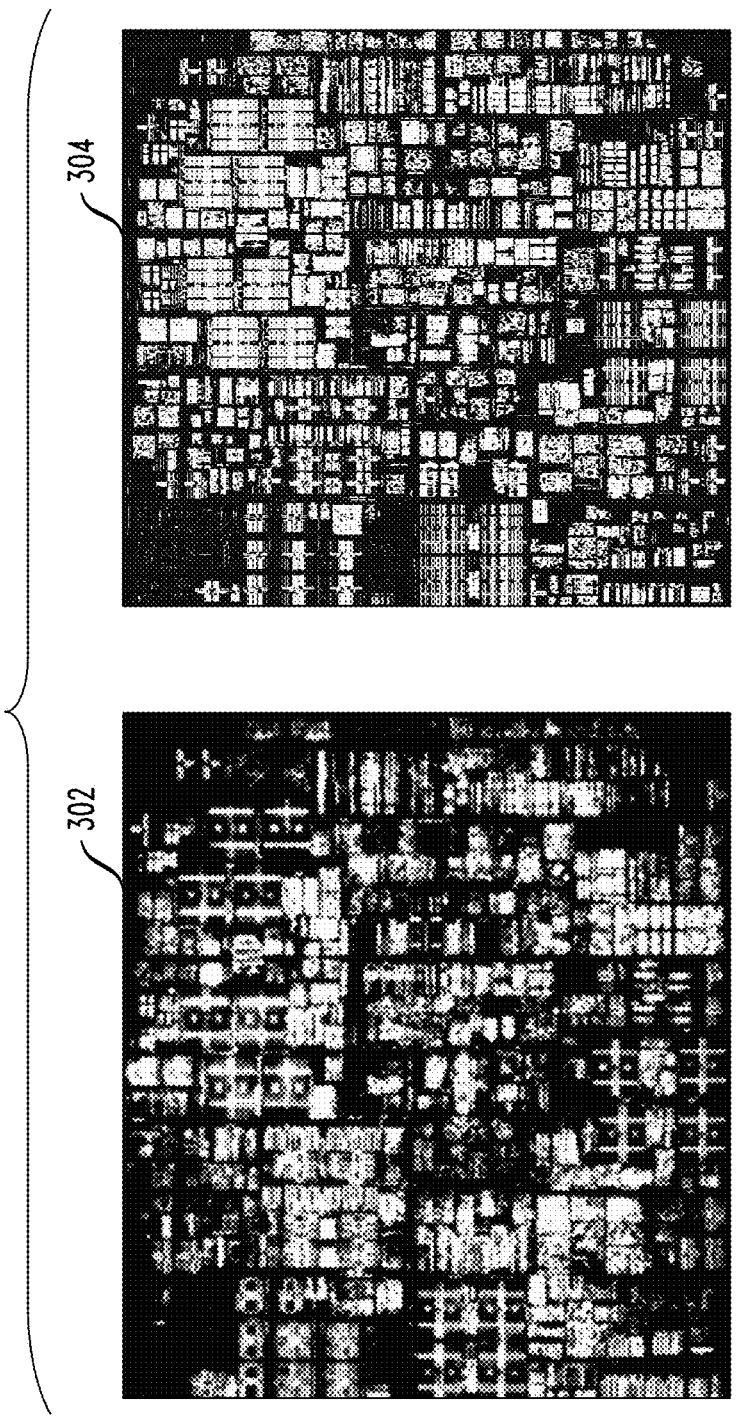
FIG. 3 presents a side-by-side comparison of a measured light emission map and a simulated light emission map.
Figure 4:
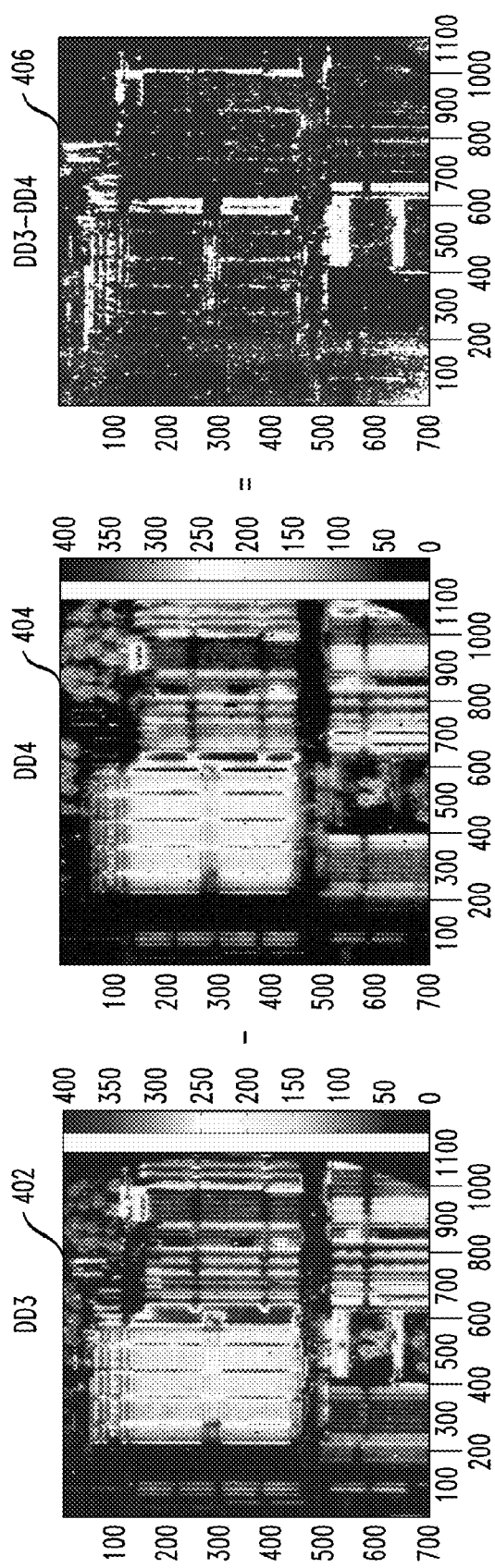
FIG. 4 illustrates how emission maps of two different chips may be compared to detect differences, according to an aspect of the invention.

FIG. 3 shows a measured light emission map 302 and its associated simulated map 304. By comparing the emission maps of chips to be verified with either: (i) the available good chip emission map (from the "golden" chip) or (ii) a "simulated" map (generated by a model based on the design data for the good chip without any malicious circuitry), the difference will reveal the areas containing changes, that is, either "added" or "removed" circuits. Therefore, the chip alterations can be detected. FIG. 4 shows the emission maps of an original design 402 and one from an "altered" design 404, as well as a map 406 of their difference. With a high resolution solid immersion lens (SIL), full thickness wafers and chips can be inspected. Using imaging process software, every field effect transistor (FET) within a chip will be visible, and therefore the whole chip can be inspected. The entire inspection procedure may be automated and made time efficient. Further details regarding the solid immersion lens are provided below with respect to FIG. 7.

The emission maps in FIG. 4 were generated in an experimental case where the changes between old design 402 and new design 404 were introduced intentionally. However, the same techniques are employed, in one or more embodiments, to detect undesired, malicious changes introduced illicitly by a foundry or other party. In FIG. 4, a difference function in MATLAB® software was employed for comparing the images (see detailed discussion of image processing below). In addition to the subtraction, a suitable normalization process can be carried out on one or both images, to adjust color or intensity levels. This takes into account the case where one of the images has a different background than the other. In general, the following equation can be employed:

$$A*\text{Image}_{OLD} - B*\text{Image}_{NEW} + C = \text{Difference} \quad (1)$$

The coefficients A and B are applied to normalize the images. $\text{Image}_{OLD}$ is the image of the "golden" chip (simulated or actual). $\text{Image}_{NEW}$ is the image of the chip under test. If there is a point in the old and new circuits known to be identical, one or both images are adjusted via coefficients A, B, and/or C to ensure that the known identical points subtract to zero in the difference. In a typical approach, areas known to have no emissions are adjusted to identical (background) levels via the coefficients A, B, and/or C.

Embodiments of the invention provide a method of detecting chip alteration using light emission from the backside of a power-on chip. The emission measurements can be taken at wafer-level or package chip-level. When no "golden" chip is available, a simulated light emission map can be generated using a suitable computation method, discussed further below. Then, the image from the "golden" chip or the image generated by software based on the design of the "good" chip is compared with an emission map taken from real hardware. The image resolution can be enhanced using a high magnification SIL inserted in the optical path of the emission detection system. The whole chip emission map can be created from many individual high resolution images taken at different locations of the chip with image processing software.

Figure 5:
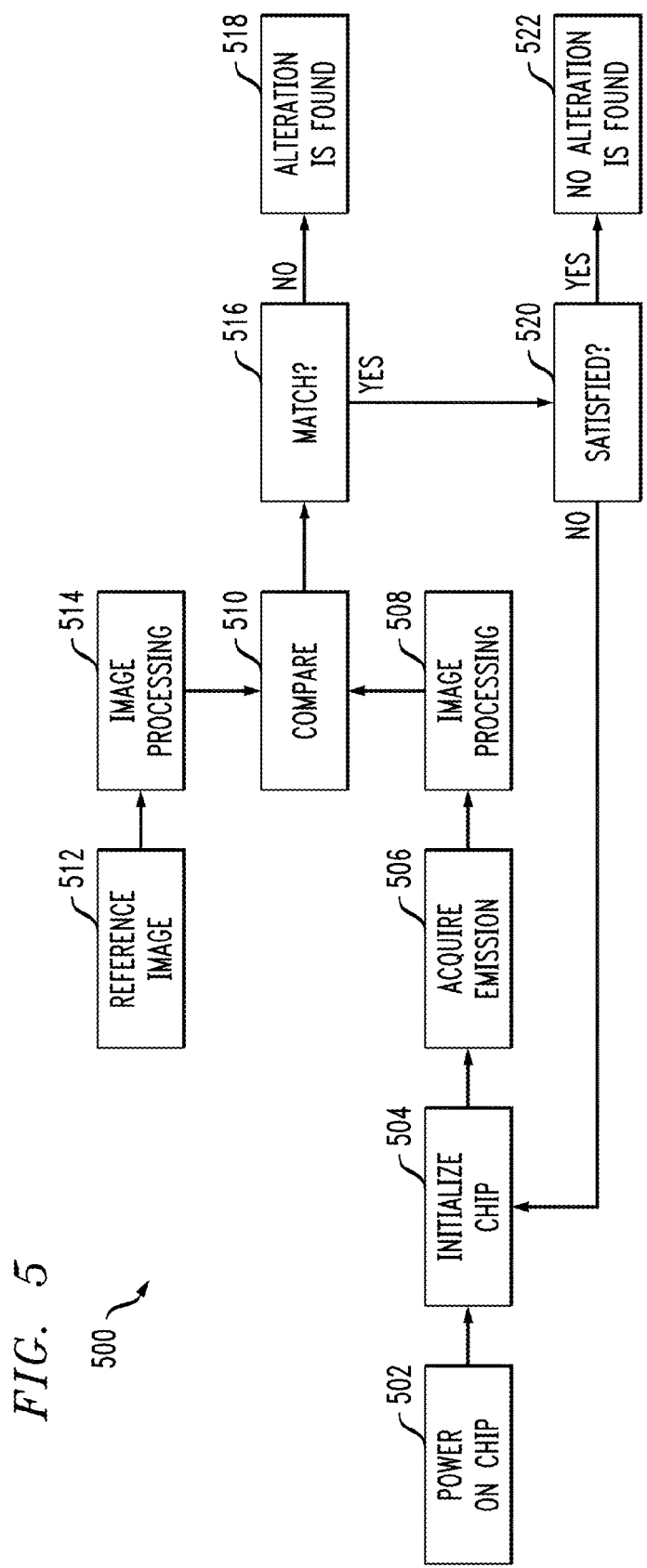
FIG. 5 is a flow chart of an exemplary method for detecting alterations in a chip, according to another aspect of the invention.

FIG. 5 shows an exemplary alteration detection method 500. First, the reference emission map 512 is created by a simulation engine (as discussed below with respect to FIG. 6), and advanced image processing 514 is applied as appropriate. The image can, of course, also be created by imaging an actual "golden" chip, where available, again, with suitable image processing. Then, a comparison is made, in block 510, with the acquired emission map 506 produced by a highly-sensitive camera with the chip being appropriately initialized. In particular, the chip to be tested is powered on in step 502, and initialized in step 504. The emission image is acquired in step 506 (in one or more embodiments, in a "quiet" state as discussed elsewhere herein), with suitable image processing in step 508, leading to the comparison just described. The initialization step 504 can be carried out, for example, through a special test pattern developed by the chip designer. An alteration is detected, as shown at block 518, when both emission maps are not matched in block 516 ("NO" branch). If there is a match ("YES" branch of decision block 516), a determination can be made in block 520 whether a satisfactory degree of confidence has been attained. If this is the case ("YES" branch of block 520), it is determined that there has been no alteration from the "good" design in the chip under test, as at step 522. Conversely, if greater confidence is desired, as per the "NO" branch of block 520, the chip is again initialized and the test can be re-run (or a different test can be carried out). Note that for illustrative convenience, decision blocks in FIG. 5 are rectangular.

Note that in the case where a "golden" chip is available, the "golden" chip should be powered-on and initialized in the same manner as the chip being tested. In the case where simulated emissions are used, the simulation models should be run for chip conditions reflecting the same initialization process as carried out for the chip under test.

Note also that while in one or more examples herein, the "golden" chip (or simulation thereof) and the chip under test are analyzed in the "quiet" state, in other instances, they could be analyzed under different states; for example, running known test conditions or the like.

Figure 6:
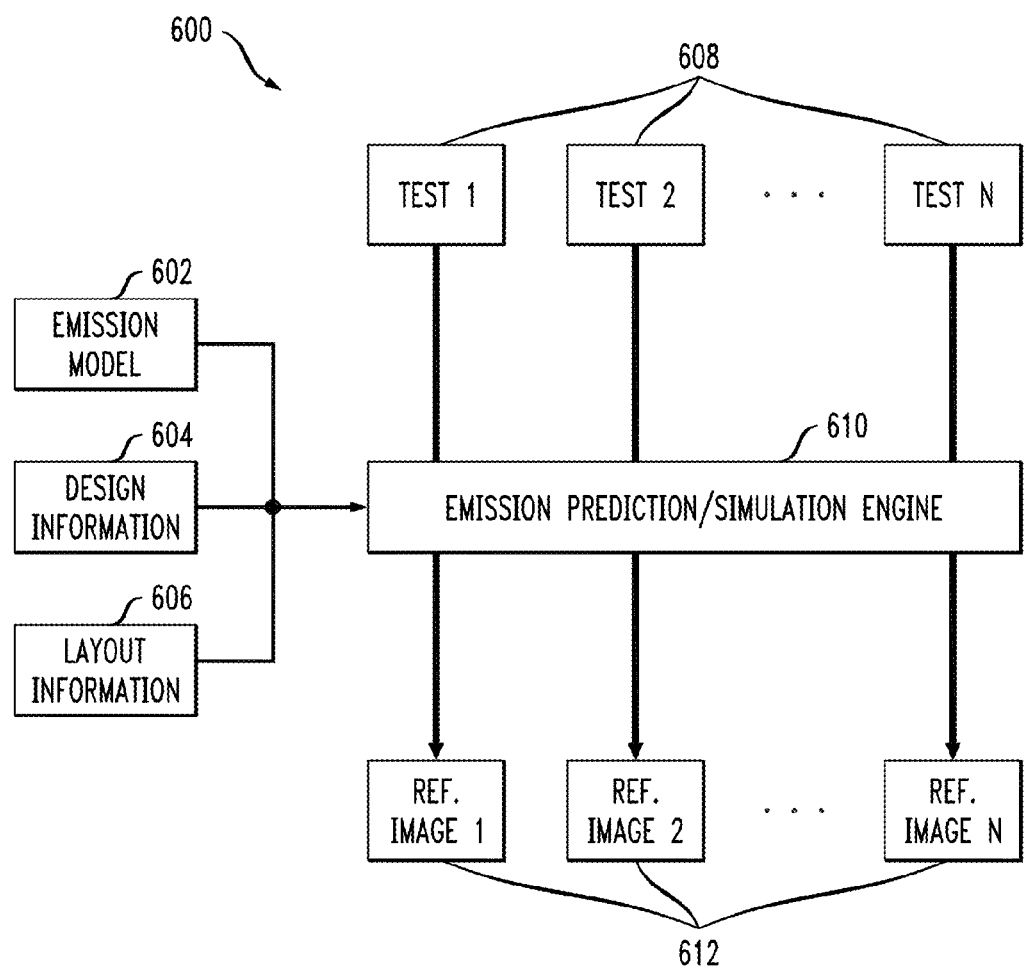
FIG. 6 is a flow chart of an exemplary emission simulation procedure, according to still another aspect of the invention.

FIG. 6 shows an exemplary method 600 for generating reference emission maps. Depending on the test patterns, different reference emission maps will be created. Emission simulation engine 610 takes into account many chip parameters, such as threshold voltage ($V_t$), device density, and the like. In particular, engine 610 takes as input, for the "good" design, emission model 602, design information 604, and/or layout information 606. In general, emission maps 612 can be created for as many test patterns 608 as desired (in this example, "N" reference images are created for "N" test patterns). In one or more embodiments, engine 610 is part of a model based DRC (design rule check) tool and methodology that uses arbitrary model forms to score how the physical design choices made at the transistor level will impact parametric performance, where each gate and its surrounding environment are analyzed and scores are assigned according to a model. The DRC can preferably provide a great deal of statistical data, including Iddq, which can be used, in one or more embodiments, to produce the leakage emission map 512. Iddq refers to the supply current consumed in the quiescent (referred to herein as quiet) state, when the circuit is not switching and inputs are held at static values. Further non-limiting exemplary information on generating reference emission maps is provided below.

One or more embodiments thus provide a method of detecting chip alteration using light emissions emitted from the back side of a power-on chip. In some instances, a specially designed calibration circuit can be embedded on the chip to calibrate measured emission maps; this calibration circuit can produce a predicted light emission. In one possible embodiment, an individual transistor of known size may be inserted so that the electrical characteristics can be measured. The emission intensity is measured at one or more bias conditions and compared to the simulated predictions. The fitting parameters of the emission model in the simulator for generating reference emission maps are adjusted based on this comparison. In another embodiment, the electrical characteristics of the gate may not be measured externally but the state of the gate is controlled digitally through the test program. The emission of the gate in each state is measured and used to calibrate the emission model. In another embodiment, the calibration structure may be a more complicated gate such as a NAND, NOR, NOT, or even entire sub-circuits.

Figure 7:
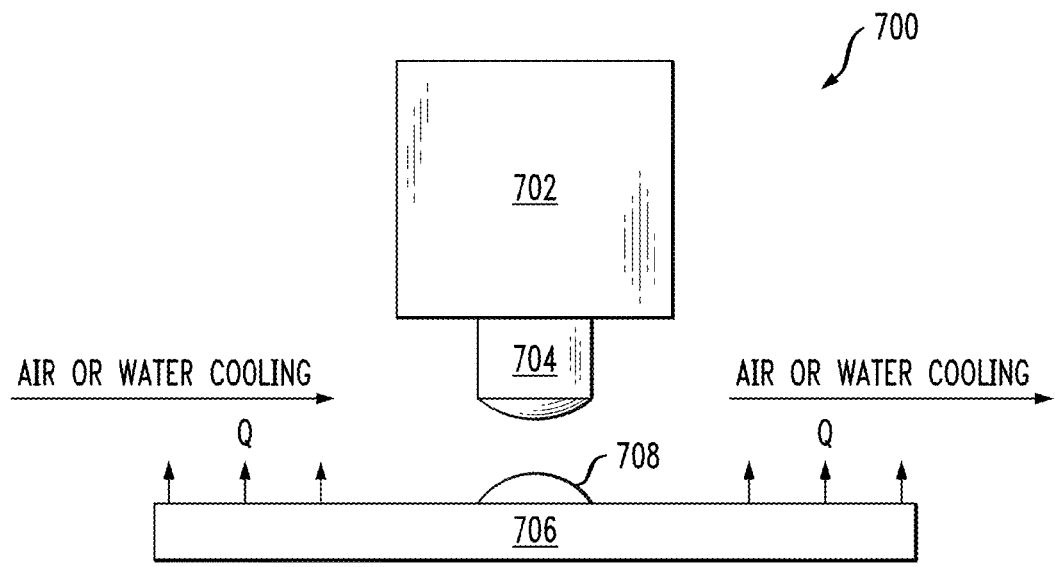
FIG. 7 illustrates use of a solid immersion lens and liquid cooling, according to a further aspect of the invention.

Furthermore, in one or more embodiments, a cooling technique is provided, to generate a uniform temperature profile on the measured chip to increase the likelihood of obtaining reliable emission maps. Since the leakage current is a strong function of chip temperature, it is important, in one or more embodiments, to make sure the chip is uniformly cooled across the back side while emission is taken. Different cooling methods can be used, such as, for example, air cooled, water cooled, and other types of gas or liquid cooling. As seen in FIG. 7, a flow of cooling media (such as air or another gas, water or another liquid) is established, drawing heat Q away from chip 706 to aid in establishing the desired uniform temperature profile.

In some instances, simulation software is provided, which can compute the light emission based on electronic design data; this simulated light emission can be used for later comparison. In one or more embodiments, image processing software integrates individual high resolution images to create a full chip map. One possible embodiment employs the method and system described in U.S. patent application Ser. No. 12/493,686 of Franco Stellari and Peilin Song, entitled "Creating emission images of integrated circuits" and filed on Jun. 29, 2009, the complete disclosure of which is expressly incorporated by reference herein in its entirety for all purposes (pertinent details included below under the heading "Mapping From Individual Images"). Thus, one or more embodiments provide techniques to compare measured light emission with a simulated emission map or a "golden" emission map.

It should be noted that one or more embodiments of the invention are directed to the case where it is assumed that the chip under test is defect-free; rather than seeking defects, one or more embodiments detect chip alteration using emission while using simulated data as a "golden" chip for analysis. Again, the data from an actual golden chip can be employed where available.

A suitable commercially available emission tool can be used to acquire images from the chips to be tested and from the "golden" chip. This tool may be able to acquire time-integrated (static) emission or time-resolved (dynamic) emission. Some non-exhaustive examples of tools in the first category include Phemos tools from Hamamatsu Photonics, the Meridian tool from DCG Systems, and others. Example of time resolved tools similar to the one described in U.S. Pat. No. 7,224,828 are available from vendors such as DCG Systems Inc. of Fremont, Calif., USA, and Hamamatsu Photonics K.K., Hamamatsu City 430-8587, Japan.

FIG. 7 shows exemplary details of a configuration 700 with a solid immersion lens (SIL) 708. Element 706 is the circuit under test. Element 702 is the microscope, with objective lens 704. In one or more embodiments, the SIL is a hemispherical piece of material, usually silicon (but other materials can be employed), which is in contact with the circuit under test 706. The SIL 708 may, in some instances, also be connected or attached to the objective lens 704 of the microscope 702. In some designs, the SIL 708 is placed on the circuit under test 706 and the objective 704 can move separately from it; while in most cases, there is a spring-loaded mechanism (not shown) which connects the SIL 708 to objective 704 so they move together. The skilled artisan will be familiar with such usage of a SIL per se, and, given the teachings herein, will be able to use the same to implement one or more embodiments of the invention.

Image Processing

With regard to image processing steps 508, 514, one non-limiting example of a suitable tool is the MATLAB® software available from The MathWorks, Inc. of Natick, Mass., USA. MATLAB® software can be employed to read, process, and display image data, including image filtering (for example, low pass and/or high pass filters, as appropriate). Image comparison can be carried out via subtraction of images, as shown in FIG. 4, or by differentiation of images, for example. A suitable threshold process can be carried out when undertaking the comparison to ensure that identified differences are real differences and not artifacts of noise. In another approach, a two-dimensional correlation function can be employed to correlate the two images to be compared; a suitably high correlation number is required in order to determine that the images "match." Individual regions of the images may also be correlated.

Digital image correlation techniques have been increasing in popularity, especially in micro- and nano-scale mechanical testing applications due to their relative ease of implementation and use. The calculated image correlation indicates the strength and direction of a linear relationship between two images affected by noise. The higher the correlation, the more similar the images are. Since noise and uncertainty may affect both the measured and simulated emission image, a suitable tolerance threshold should be set to decide if two images are substantial identical, notwithstanding the previously mentioned source of errors, or show significant differences due to possible alterations. In one embodiment, the measured and simulation images may be broken down in smaller portions; each measured portion may be correlated with its correspondent simulated portion, thus leading to a correlation coefficient for each couple of sub images. The correlation coefficients can then be computed and the lower scoring one(s) selected as candidate(s) for alteration regions. By repeating the same process at increasingly smaller sub-images and/or higher magnification of the optical system, the alteration regions of the image can be narrowed down. Also, by looking at the variability of the correlation coefficients, the skilled artisan, given the teachings herein, will obtain a sense of the appropriate threshold for detecting alterations.

The skilled artisan will be familiar with MATLAB® software and similar software packages, as well as subtraction and differentiation of images, and correlation functions, and, given the teachings herein, will be able to employ same to implement one or more elements of one or more embodiments. Other non-limiting examples of suitable software for subtraction, differentiation, and/or correlation, and the like, are MAPLE™ software, available from Maplesoft, a division of Waterloo Maple Inc., Waterloo, Ontario, Canada and MATHEMATICA® software, available from Wolfram Research, Inc., Champaign, Ill., USA. Solutions can also be coded in C code.

Chip Initialization

With regard to chip initialization 504, in one or more embodiments, the chip is powered on first in step 502, and then the chip is initialized through its scan chain. The test patterns can be designed such that the whole chip will be in a quiet state (no logic contention). Non-limiting examples of test patterns include 0101010101 . . . ; 001100110011 . . . ; 00000000000000000 . . . ; or 111111111111111 . . . . The last two are normally referred to as a flush test. The skilled artisan will be familiar with the "flush and scan" process to place a chip in a quiet state where there are no logic transitions. The skilled artisan will also appreciate that after power-on and before initialization, the chip is typically not "quiet" due to orthogonal conditions on the chip resulting in conflict.

Generating Reference Emission Maps (Emission Prediction)

This section provides further details on emission prediction and/or simulation engine 610. Reference should again be had to FIG. 6 as well as to flow chart 900 of FIG. 9 and the illustrative example of FIG. 10. The method formally begins at step 902. In one or more embodiments, begin with a layout database 606, as in step 904. Such a database typically is a GDS or OASIS file (a binary file) containing polygon information which represents the physical design of the chip from a "design shop," that is, a company or other organization which develops designs for fabrication (e.g., by a foundry). Designs are typically submitted to foundries in a shapes database in GDS, GDSII (GDS2), GL1, OASIS, map files, or any other suitable format for storing such design data structures. In essence, the shapes database is a collection of floating point numbers on different layers that represent the different steps in the physical design process. For example, there may be a polysilicon isolation layer represented as a series of polygons on a level in the shapes database, which is then eventually made into a mask, and that design is then transferred onto the silicon. One or more suitable state vectors, discussed below, are used to specify one or more test conditions 608, as also indicated in step 904.

The aforementioned shapes database can be related to the leakage current (Iddq) of an individual device on the chip. The shapes database will typically have hundreds of different polygon levels and billions of shapes. "Zooming" in to the sub-micron level, individual transistors would be seen, represented by combinations of layers, in accordance with a so-called technology design manual. For example, in such a manual, a silicon isolation level might be called RX, and the gate level might be called PC (for "polycrystalline"). In addition, there may be implant layers which determine whether a device has a low or high threshold voltage or is an n-type field effect transistor (NFET) or p-type field effect transistor (PFET). The combination of the isolation, gate interconnects, and well implants, will all assist in fully describing the devices, as indicated in step 906. In addition, on top of that just described, there will be a series of metal layers and interconnects which wire up the devices to form circuits. This type of information (RX, PC, type of FET, threshold voltage, effective width, effective length, lithographic features, and the like) is used to model the devices to determine the anticipated leakage current, as also shown in step 906, based on a well-known model such as the SPICE model or BSIM model available from the BSIM research group of the University of California at Berkeley. Such models are typically used for design predictions before a design is presented to a foundry. Thus, in general, design information 604 is employed together with layout information 606 to implement the emission prediction.

The calculated leakage current can take into account, where required, phenomena such as the narrow channel effect and n-well scattering. These cause shifts in the threshold voltage based on certain well-described phenomena. In the case of the narrow channel effect, if there is a device with a small effective width, the threshold voltage tends to be slightly lower than expected due to some of the dopants diffusing out of the active silicon. Similarly, if a device is close to a well boundary, it tends to have a higher threshold voltage than expected. When carrying out an n-well implant, particularly in bulk technology, it is a high-energy implant, and it can tend to scatter off of the resist wall, so that if the device is close to an n-well shape, the threshold voltage will tend to be higher due to the high energy implant tending to scatter off of the wall and into the device itself. The narrow channel effect and n-well scattering are exemplary of a variety of modeled phenomena which can be taken into account in determining the Iddq accurately for each device, to obtain accurate sampling and oversampling. Calculating the threshold voltage precisely aids in determining the emission precisely. Note that well proximity effects are known to the skilled artisan from, for example, U.S. Pat. No. 7,089,513 to Bard et al., entitled "Integrated circuit design for signal integrity, avoiding well proximity effects," the complete disclosure of which is expressly incorporated herein by reference in its entirety for all purposes.

Parameters of interest in calculating Iddq include gate space, gate width, gate effective length, stress parameters (distance of diffusion boundary with respect to the gate), corner rounding, and so on.

In one or more embodiments, care is taken to model the phenomena believed to be significant for determining leakage current, and the expected leakage (and hence emission) is calculated for every transistor on the chip; this may include millions or indeed hundreds of millions of devices. Once the leakage current has been predicted for every transistor on the chip, the information is summed up into a leakage map, which describes regions of the chip having higher or lower leakage. To reiterate, at this point, every transistor on the chip has a leakage associated with it.

In an additional step 908, partition the chip 1000 up into small grids or tiles 1002, referred to herein as sub-Nyquist grids or tiles, and sum up the leakage currents for all the devices within each tile in step 910. These grids or tiles (also called blocks—there are eighty in FIG. 10)) should be much smaller than the resolution of the camera (or human eye) that is to be used to obtain the images of the chip to be tested. For example, if a 10 mm×10 mm chip were being analyzed, it would be important to sum the grids or tiles at a resolution much smaller than that which can be realized with an imaging tool or the human eye, to prevent aliasing. Furthermore, if, for example, the minimum resolution of the camera and lens system is 5 microns, then the sub-Nyquist grid should be less than or equal to 2.5 microns to prevent aliasing.

At this point, what is present is the total leakage in each grid, tile or block 1002 (e.g., 2, 3, or 5 micron blocks; in one non-limiting example, the tiles might be 5 microns by 6 microns). As per step 912, the initial sub-Nyquist grid should then be oversampled (on the aforementioned Nyquist grid, or the field of view, whichever is smaller) to provide smoothing. In one or more embodiments, if the field of view is less than 100 microns, use an oversampling grid of FOV/4; otherwise, use an oversampling box of 100 microns for full chip view emission maps. In oversampling, the calibration structures mentioned elsewhere can be employed. In essence, a bigger window 1004 on the order of tens or hundreds of microns (or the field of view or some faction thereof) is "slid" (convolved) with the small grid tiles 1002 to provide the smoothing.

To summarize, in one or more embodiments, begin with the layout database, recognize the individual devices therein and how they are connected, then identify the amount of leakage on every device, use a fine grid to measure the leakage in every small tile, and oversample to provide smoothing expected when using a tool on a physical chip.

To determine the light emission once the leakage currents have been calculated, employ emission model 602, in step 914. An essentially linear relationship can be assumed, in one or more embodiments (that is, the higher the leakage current, the higher the emission). In other instances, different functional forms can be used. Dedicated calibration circuits can be placed on physical chips in at least some instances, and data collected therefrom can be reduced to determine the functional form of emissions as a function of leakage current, so that a leakage map can be converted to an emission map. In a general case:

$$\text{Emission}=f(\text{parameters}), \quad (2)$$

where the parameters include Iddq, temperature, voltage, and so on, as discussed elsewhere herein; and the emission is expressed in arbitrary units.

Emission tools typically work by reading the leakage emission which corresponds to a certain light wavelengths and color-mapping based on intensity. In one or more embodiments, a tool for emission prediction discretizes the currents into pixels and then seeks to re-create an intensity map as would be obtained from an emission tool measuring emission from a physical chip. To effectuate this, it is advisable to reduce or eliminate any distortion based on sampling or calculation. Thus, the initial sampling or discretization is carried out on a relatively small grid, with smoothing by the oversampling to mimic the results expected from an emission tool measuring emission from a physical chip. Appropriate use can be made of the aforementioned calibration structures as described elsewhere herein. Stated in another way, the simulated emission image should be matched to the pixel size and camera position of the actual image obtained from the physical chip under test. For example, if "zoomed out" looking at the whole chip, versus "zoomed in" looking at, for example, a single clock buffer, the sampling would need to change to match the resolution differences. That is, the sampling in the simulation technique is related to the field of view so as to replicate the resolution expected for the actual tool looking at a physical chip. The ultimate result is one or more reference images 612 corresponding to the one or more state vectors. Processing continues in step 916.

By way of re-statement, the predicted emission (since based on leakage current) is at the transistor level. These individual predicted emissions are then "bucketized" into buckets that correspond to the sub resolution pixels of the camera that will be used to analyze the image of the actual chip. Oversampling of these pixels thus enables an accurate prediction to be generated without aliasing. Each pixel of a camera will cover a certain known area of a physical chip (depending in the zoom; for example, in a 10×10 array of pixels viewing a 100 micron×100 micron area, each pixel maps to 100 square microns, while if "zooming out" so that the 10×10 array of pixels views a 100 cm×100 cm area, each pixel maps to 100 square centimeters). In one or more embodiments, it is advisable that each pixel be bucketed into a 2×2 sub pixel to prevent aliasing. This is the concept referred to as a sub-Nyquist pixel. In one or more embodiments, the reason for not going even smaller in this regard is the impact on technique runtime, and because it is too far below resolution to matter. Oversampling then allows accurate reproduction or prediction of the image without introducing distortions due to sampling frequency.

By way of another example, consider a 100 micron×100 micron field of view (FOV), with a 5 micron by 5 micron intense region with low threshold voltage devices in the center. A picture of the entire FOV would typically not resolve the small intense region, but rather, there would be some bleeding. Sliding the window in the oversampling process allows the emission prediction to match the characterization structures. The oversampling mimics different diffusion or diffraction lengths, allowing "tuning" into a realistic predicted image.

The steps described up to this point in this emission prediction section can, in one or more embodiments, be carried out by a distinct software module, such as an emission prediction module, embodied in a computer readable storage medium and executing on at least one hardware processor. In one or more embodiments, determining leakage currents from a layout database can make use of known techniques, such as those set forth in US Patent Publication 2009/0106714 of Culp et al., entitled "Methods and system for analysis and management of parametric yield," published Apr. 23, 2009, the complete disclosure of which is expressly incorporated herein by reference in its entirety for all purposes.

As noted, the modeling process discussed herein preferably employs one or more state vectors. A chip may have, for example, a million scannable latches or flip flops, each of which may have a voltage level of logical zero, logical one, or floating, which can be used to set the logic value of each internal gate on the chip. When measuring the emission map from the physical chip, as noted elsewhere herein, the chip is initialized with a suitable pattern. This pattern applied to the physical chip corresponds to a state vector used as an input to the model, such that the model will model the chip in a similar logic state as is the physical chip being measured. Of course, depending on its state, the same transistor may emit differently or not at all. Many designs (perhaps 90% or more) have resident on them unused logic; that is, transistors currently not used, but available to add a logic gate, inverter, or the like, as needed (simply by changing only the wiring in the back-end-of-line). Persons wishing to introduce malicious circuitry might identify such unused logic and wire it up differently. The state vector input to the prediction model allows detection of this type of tampering with unused logic (e.g., unused gate arrays).

Given the discussion thus far, it will be appreciated that, in general terms, an exemplary method, according to an aspect of the invention, includes obtaining an emission map of a circuit to be tested for alterations, as in step 506; obtaining an emission map of a reference circuit, as in step 512; and comparing the emission map of the circuit to be tested with the emission map of the reference circuit, to determine presence of the alterations, as in step 510. In one or more embodiments, an additional step includes normalizing the emission map of the circuit to be tested and/or the emission map of the reference circuit, prior to the comparing step, as per steps 508, 514. The comparing step 510 may include, for example, subtraction, differentiation, and/or applying a two-dimensional correlation function.

The emission map of the circuit to be tested can be obtained by an emission tool. In a preferred approach, liquid cooling is applied to the circuit to be tested 706 while obtaining the emission map, a sin FIG. 7. The circuit to be tested is preferably initialized, as per step 504, prior to obtaining the emission map.

In some instances, the reference circuit is physically available, and the emission map of the reference circuit is obtained by an emission tool. In such cases, the reference circuit is also preferably initialized prior to obtaining the emission map of the reference circuit. In other instances, the emission map of the reference circuit is obtained by simulation; in a non-limiting example, as explained with regard to FIGS. 6, 9, and 10.

Figure 9:
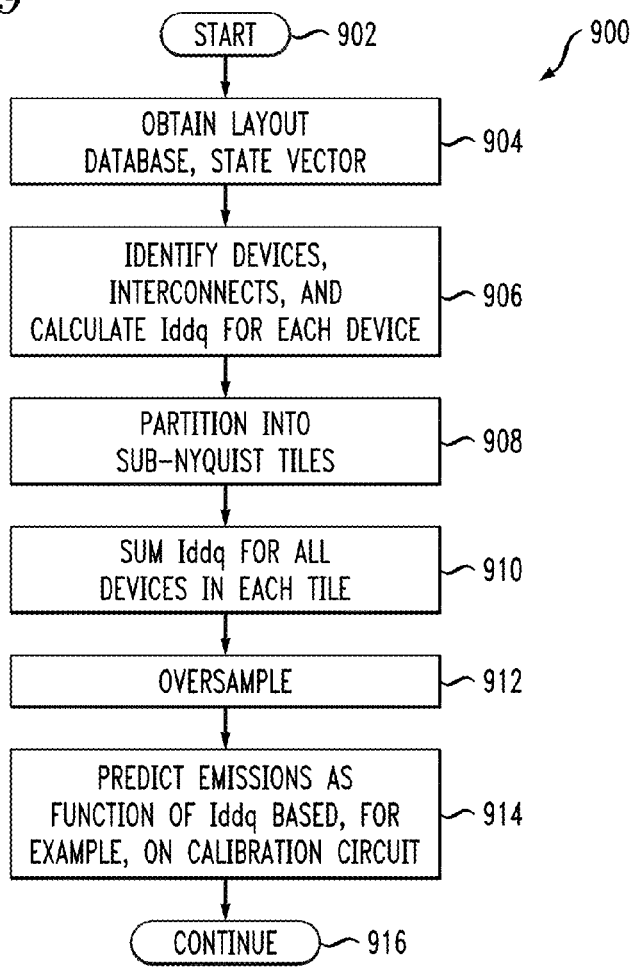
FIG. 9 is a flow chart of an exemplary emission prediction technique, according to a still further aspect of the invention.
Figure 10:
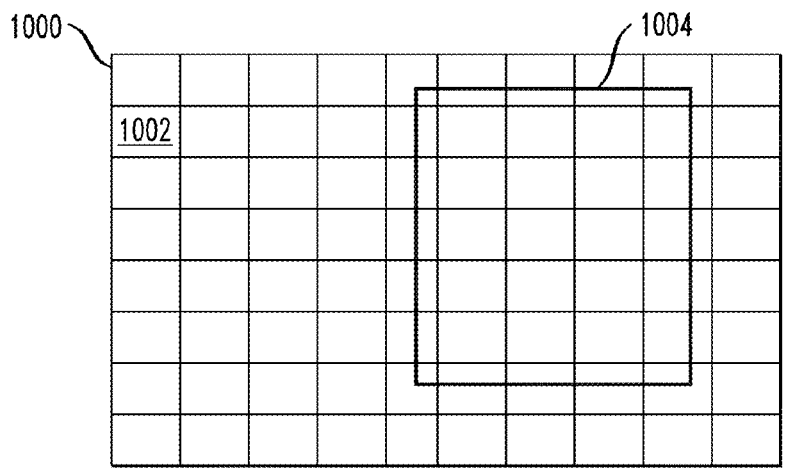
FIG. 10 illustrates exemplary sub-Nyquist tiles and an exemplary oversampling window, according to an even further aspect of the invention.

With particular reference to FIGS. 9 and 10, in some cases, the simulation includes calculating a leakage current for each of a plurality of devices of the reference circuit, based on a layout database and a state vector, as in step 906; as well as dividing the reference circuit 1000 into a plurality of sub-Nyquist tiles 1002, as per step 908. A further step 910 includes summing the leakage current for each of the devices in each given one of the sub-Nyquist tiles to obtain a resultant grid. An additional step 912 includes oversampling the resultant grid. As in step 914, apply a functional form to obtain the emission map from the leakage currents in the resultant grid; the functional form can be based, for example, on data gathered using a calibration circuit.

As seen in FIG. 7, in some instances, the emission map of the circuit to be tested is obtained using a microscope 702 with an objective lens 704. Optionally, SIL 708 is introduced between the objective lens 704 of the microscope 702 and the circuit to be tested 706.

In some cases, the alterations to be detected include tampering with unused logic, such as, by way of example and not limitation, unused gate arrays.

Mapping from Individual Images

Figure 11A:
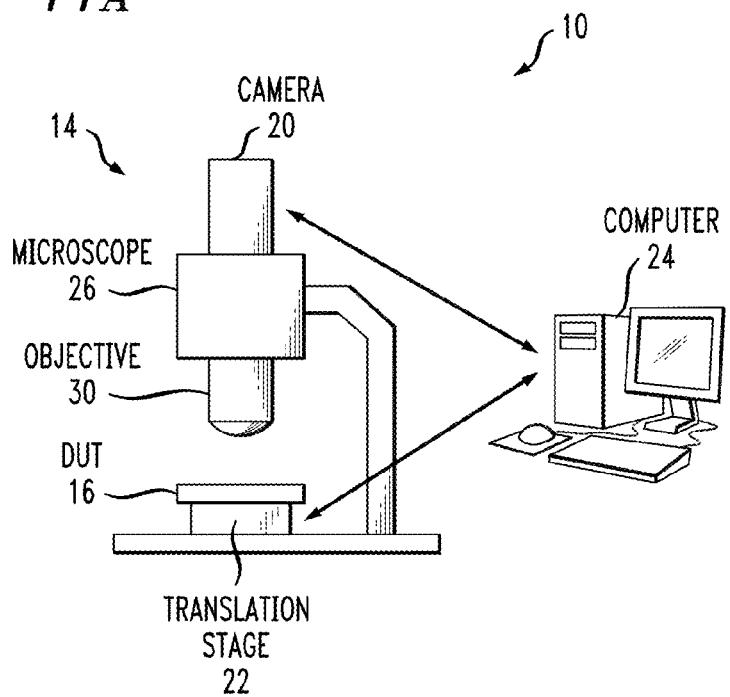
FIGS. 11A and 11B illustrate techniques to create a map from individual images.
Figure 11B:
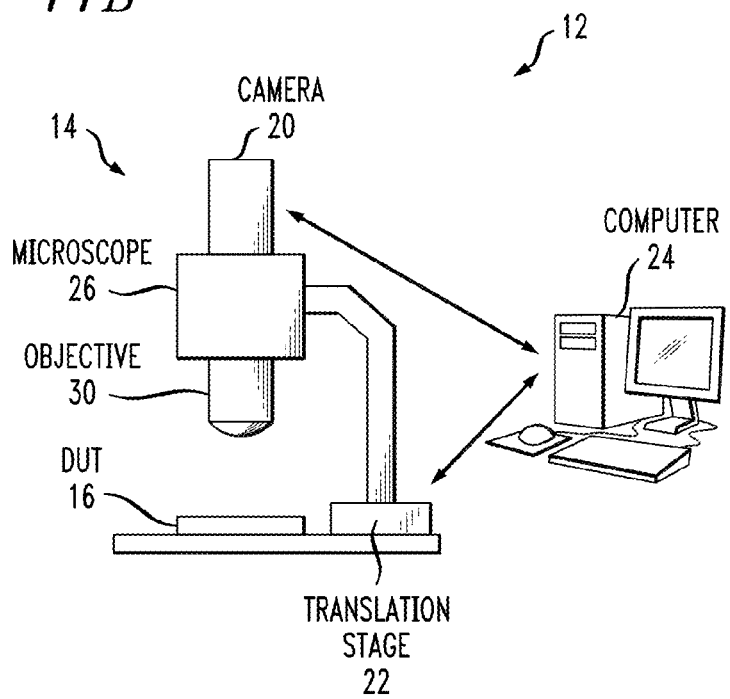

FIGS. 11A and 11B show two embodiments of systems 10, 12 for mapping from individual images. Generally, each system includes an optical system 14 for collecting light from a device under test (DUT 16), an imaging detector 20 for measuring the light intensity, a translation stage 22 for moving either the DUT relative to the optical system or the optical system relative to the DUT, and a control unit 24 that controls this movement, the acquisition of the images, and the merging/stitching of the images into a single image with high resolution and large area coverage. The merging/stitching could also be done offline on a different computer in some embodiments.

In these embodiments, the optical system 14 includes a microscope 26 and an objective (or one or more lenses) 30 for collecting the light from the DUT 16. In order to allow for relative movement of the DUT compared to the optical system, either the DUT (as shown in FIG. 1A) or the optical system (as shown in FIG. 1B) is mounted on the translation stage 22. The stage is connected to the control unit 24, which may, for example, be a personal computer that is used to move the stage to the desired positions necessary for the acquisition.

A camera 20 is mounted on the microscope 26 and the collected light is focused on such detector for being acquired. The detector could be of different types such as back-illuminated or intensified Charge-Coupled Devices (CCDs), InGaAs cameras, MgCdTe (MCT) cameras, Photo-Multiplier Tubes (PMTs), as well as additional types of new cameras and materials that are sensitive at the near-infrared region of the spectrum. Different types of cameras may be chosen depending on their spectral response, noise, sensitivity, number of pixels and pixels size. The camera 20 is controlled by the computer 24 that permits starting/stopping an acquisition, retrieving the image from the camera and storing it in memory or on a disk for further analysis.

The pixel size and the magnification of the objective 30 used by the optical system 14 determines the smallest feature that can be detected in a single acquisition. Also, the size of the detector active area and the objective determine the maximum field of view of a single acquisition. For a given camera, an objective magnification is selected primarily to achieve the desired spatial resolution. For example, let a be the size of the camera pixels and let m×n be the number of pixels for the detector. Therefore, using a magnification equal to M, one could expect to achieve a resolution of a/M and cover a DUT area of am/M×an/M.

Figure 12:
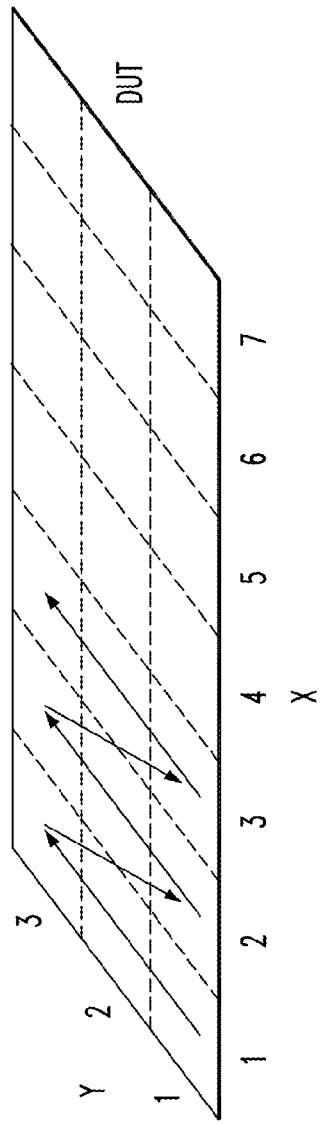
FIG. 12 shows an example of a scanning pattern that may be followed by an optical system to cover a region of interest.
Figure 13:
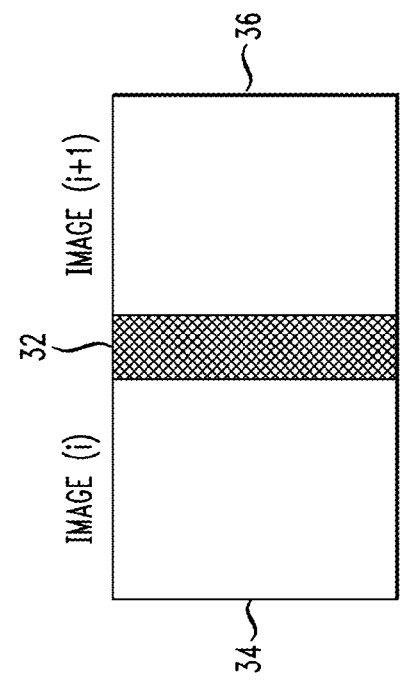
FIG. 13 shows two overlapping images of neighboring regions of a device under test.

Of particular interest in this section is the case when at such conditions, the area of interest for the acquisition of emission is larger than the field of view of the system. In such case, multiple images can be acquired by moving the DUT relative to the optical system. FIG. 12 shows an example of a scanning pattern that may be followed to cover the entire region of interest (other schemes may be followed, including scanning along other directions or a concentric pattern). The movement of the DUT should be smaller than the field of view of the optical system so that two images (i) and (i+1) of neighboring regions contain an overlapping portion, as shown at 32 in FIG. 13. The computer uses the overlapping area to finely adjust the relative position of each couple of images 34, 36 and subsequently stitch them together to create a larger image with the same spatial resolution of the individual images but with an area larger than the individual images, equal to the entire area covered by the stage movement.

A given objective, optical system and camera combination allows for a certain spatial resolution and field of view of the DUT. Therefore, if a certain magnification is selected for obtaining a desired spatial resolution, the region of interest (ROI) of the DUT may not fit in the field of view of a single emission image. To address this issue, in one or more instances, acquire several, partially overlapping, emission images at the specified resolution, until the entire ROI has been imaged. The individual images are subsequently stitched together by using appropriate programs and methods to obtain a single large image of the emission from the entire ROI at high resolution. To achieve the coverage of the entire ROI by the system, the DUT is moved relative to the optical system (see FIGS. 11A and 11B).

Figure 14:
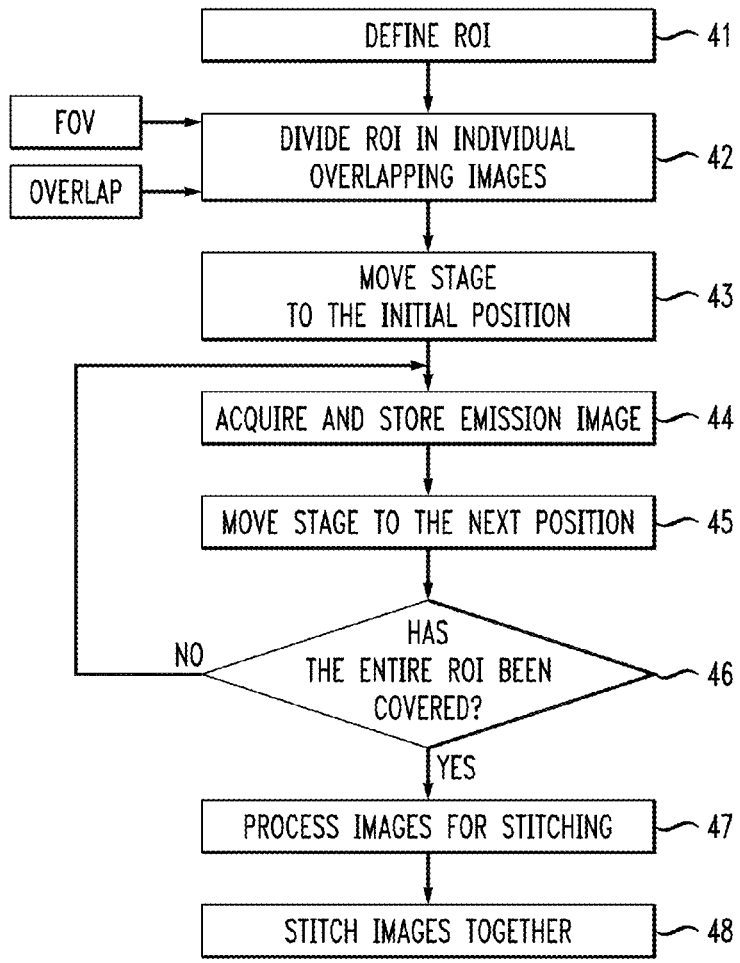
FIG. 14 is a flow chart depicting a method of stitching images.

FIG. 14 shows a flow chart of a method. At step 41, a ROI is defined by the user where the emission has to be acquired and such ROI is larger than the FOV of the optical system at the magnification necessary for the desired spatial resolution. Based on the FOV and Overlap size, the ROI is subdivided, at step 42, into individual, partially overlapping, images. The location of each individual acquisition is computed; and then at step 43, the stage is moved to the first location and then through all the locations, and, as represented at steps 44, 45 and 46, each time the stage is moved, an emission image is acquired and stored for later processing. When the entire ROI has been covered by the acquisitions, the individual images are then processed at step 47, and stitched together at step 48.

It is also possible that while the controller/computer is waiting for the stage to move, and/or a new image acquisition to complete, it works on the merging and stitching of the previously acquired images. For example, the first image is acquired and stored; then, the stage moves to the second location. The second image is also acquired and stored. Then a movement to the third location is initiated and in the meanwhile the first two images are processed and merged together. While a new image is acquired, the latest image is merged to the previous one, thus creating a partial stitched image. This method could speed up the overall process since 47 and 48 would not need to be done sequentially but in parallel with the stage movement. Another advantage would be to show the user the partially stitched image in real-time so that actions may be taken, such as stop the process, change some parameters, and so on.

Figure 15:
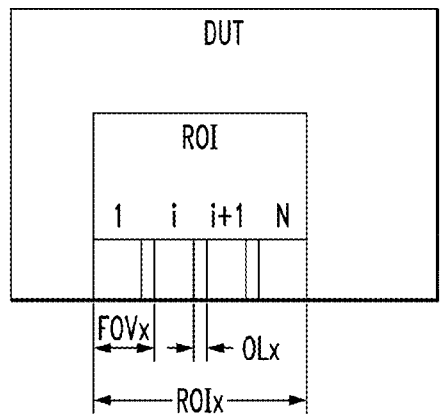
FIG. 15 shows a region of interest of a device under test and illustrates several parameters associated with that region of interest.

The minimum amount of image overlap necessary for proper stitching depends on many factors, including the emission intensity, image quality and emission pattern. Usually one wants to make sure that the overlapping area contains enough features to enable a proper matching and stitching of the images. With reference to FIG. 15, considering one dimension of the ROI (x), calling ROIx the size of the ROI in such direction and FOVx the size of the field of view covered by one image in such direction, the minimum number N of images necessary for covering such dimension is given by N=ceil(ROIx/(FOVx−OLx)). OLx is the overlap of the images and the ceil( . . . ) function rounds the number to the next largest integer.

As a non-limiting example, consider a real life case of emission measurement in which 2×2 images are required to cover the entire ROI. Suppose four images were acquired to cover the ROI. In this case, aberration and distortion might be present at the edge of the images due to limitations in the optical system. Neighboring images may be cropped on the sides to remove such aberration or distortions of the optical system. The overlapping area between the ith and (i+1)th images (for example, bottom images) can be estimated based on the knowledge of the stage movement and size of the FOV. The corresponding overlapping area is then selected in both images for analysis. This step is useful because the movement of the translating stage between two images is only approximately known due to factors such as mechanical limitation, slack in the stage and thermal drifts. Consequently a method is used for finely adjusting the relative position of the two images due to the fixed resolution obtained by the optical system: a shift between the two overlapping regions is accurately calculated and used to stitch the two images after finely correcting the stage movement.

In one or more instances, a cross correlation function of the two overlapping areas is calculated. The maximum of the cross correlation curve can be located and the corresponding location indicates the correct fine shift of the two overlapping areas. The stitching process may, for example, proceed by stitching together all the images in each row of images and then subsequently stitching together the larger images corresponding to the rows. The process is repeated for all the neighboring images in both directions, until a single large image at high resolution is obtained.

A similar result may be achieved by merging first the images in columns and then stitching together the column images. Additionally images may be attached one at a time, without being organized in rows or columns. In this case, the same process used for two images may be used except that one of the two images may be larger and composed of previously stitched images.

Different types of techniques may be used to estimate the amount of fine shift necessary to properly align two neighboring images, or two columns, or two rows. In one embodiment, a 2D cross-correlation is used, the 2D maximum is used, and the coordinates of the maximum are the x and y shift of the image.

In some instances, a combined methodology of shifting and cross correlation is used. For example, consider the case of stitching together two neighboring images on the same row that have been obtained by moving horizontally the DUT relative to the optical system. In this case, the vertical shift is usually small, while the shift in the direction of the movement is the one with the larger uncertainty. For this reason, a small vertical shift of one image compared to the other may be introduced, and for each pixel shift, the 2D cross correlation of the two overlapping areas is computed, and the maximum is recorded for each shift. After all the allowed shift values have been evaluated in this way, the maximum of all the calculated cross correlation maxima is identified. The vertical shift corresponding to that value is used to shift the images vertically and the horizontal shift is obtained from the cross correlation function corresponding to that value. The use of only a one dimensional cross correlation allows for significantly speeding up the matching technique for cases where the number of images is large.

In some cases, the cross correlation technique may be replaced by a differentiation technique. After appropriate processing, such as image filtering and adjustment of the intensity levels, the overlapping regions of the two neighboring images are subtracted/differentiated (pixel by pixel), and the integral of the absolute value of the difference of each pixel in the overlapping region is computed and can be used as a figure of merit (FOM) of the proper overlapping. By introducing x and y shifts in the relative overlapping region and computing the corresponding FOM for each x and y shift, one can create a 2D curve measuring the quality of the overlap. The minimum of such curve identifies the minimum difference between the two overlapping regions. The x and y coordinate of such minimum correspond to the optimal shift of the two images that offers the best matching.

Figure 17:
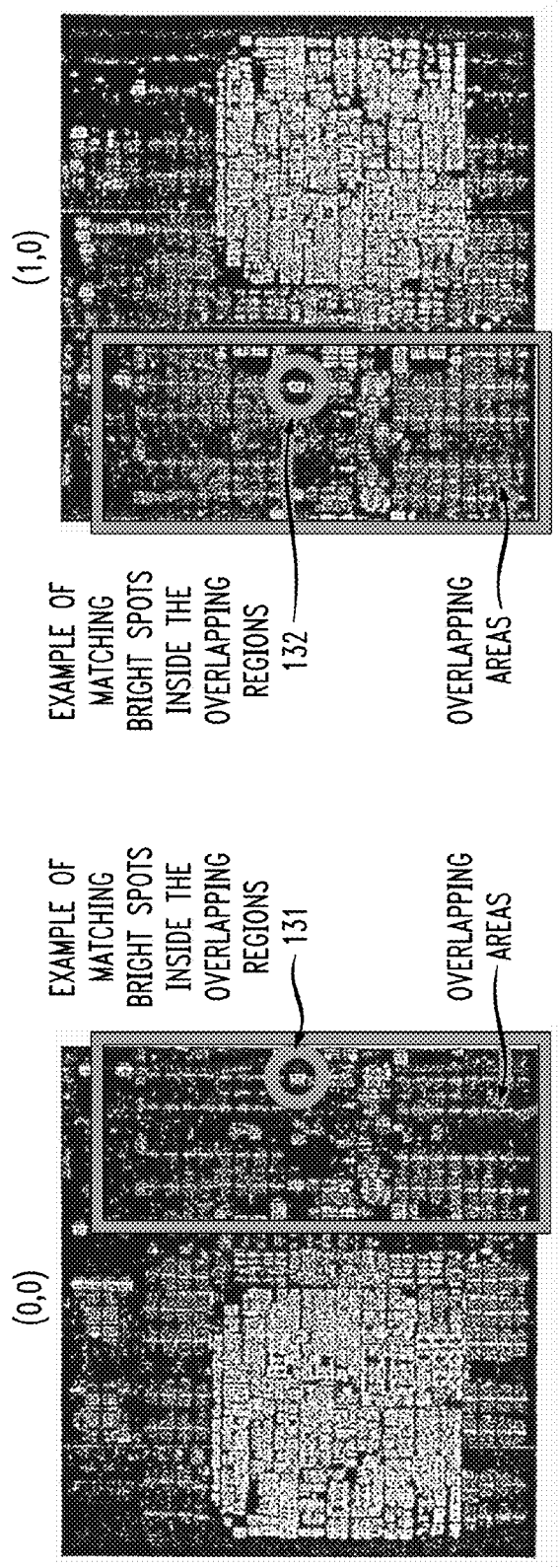
FIG. 17 illustrates one procedure that may be used as a first approximation to match overlapping regions of two images.

In some embodiments, regions of higher emission within the overlapping area are selected for the technique that will be used for matching the images (e.g. the cross correlation technique). In fact, emission images may be very weak, especially at higher magnifications, and the camera noise as well as spurious emission peaks such as those due to alpha particles may make more difficult the exact matching of the emission on relatively large overlapping areas. Therefore, by selecting regions of higher emission one could have the technique work on data with a better signal to noise ratio. Additionally, as shown in FIG. 17, bright spots 131, 132 may be used for a quick, first approximation of the images, followed by a more precise matching technique. However, since the gross alignment has been done already, the more precise cross correlation technique may be limited to smaller allowed shifts, thus improving the speed even further.

During the stitching of two neighboring images, after the correct shift has been calculated, filters (image processing) may be applied to the overlapping area in order to reduce the noise. In particular, in one embodiment, since the emission from the same area has been acquired twice, the two overlapping areas may be averaged to reduce the noise; if the overlapping areas are a significant portion of the final images, this could significantly improve the overall quality of such final image. In another embodiment, the two overlapping areas are differentiated to locate large isolated peaks that are present only in one of the two overlapping regions but not the other. These peaks are not related to the intrinsic emission from the chip (since they are not in both images) but are due to noise, alpha-particles or artifacts of the camera. Therefore, once identified they can be removed from the original image, thus improving its signal to noise ratio.

A method has been described for creating emission images of large areas of a chip at high resolution by stitching together individual images of smaller areas. The method requires the relative movement of the DUT compared to the optical system so that partially overlapping images of the entire ROI are acquired. In this embodiment, the number of images, the overlapping portion and the stage positions at which the images are acquired are predetermined before starting the acquisitions. However, this is not necessary to other embodiments and may lead to situations where the overlapping region does not contain enough emission feature to allow a desired matching by the cross correlation technique.

Figure 16:
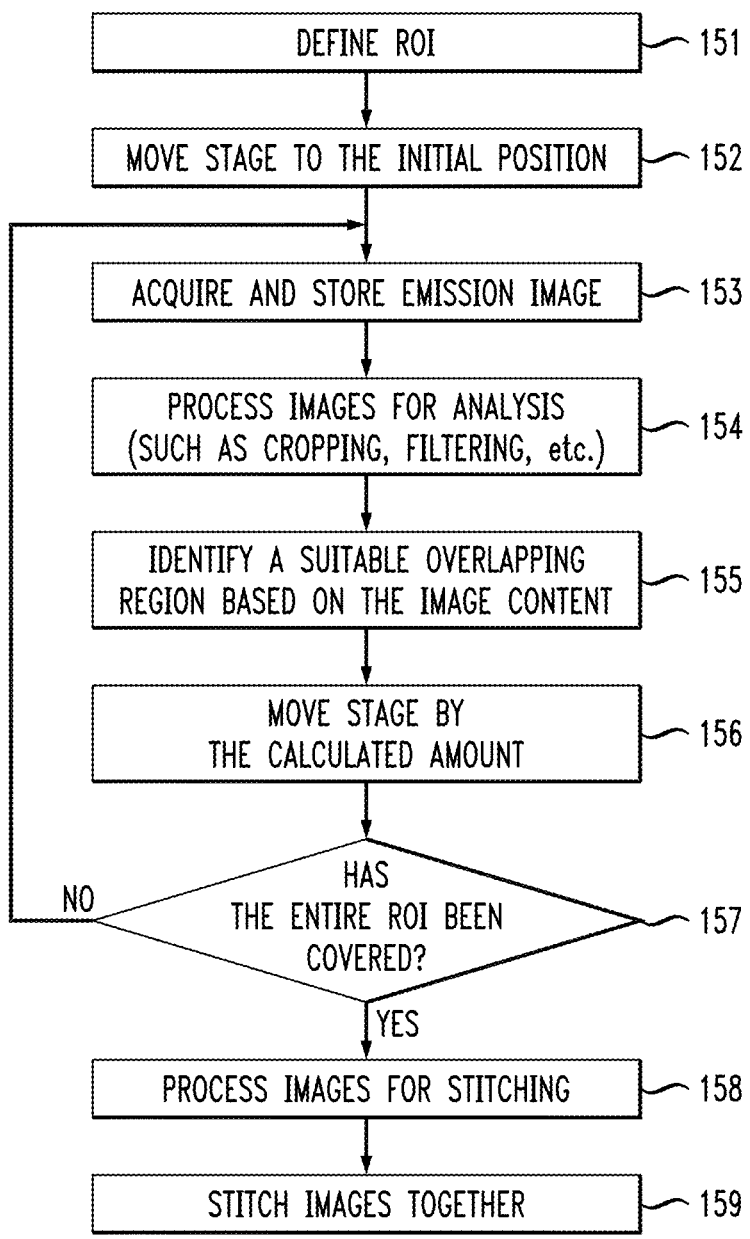
FIG. 16 is a flow chart of an adaptive method for determining positions at which images are acquired.

To address this issue, in some instances, the technique depicted in FIG. 16 may be employed. In this method, at steps 151, 152, 153, the region of interest is defined, the translation stage is moved to an initial position, and a first emission image is acquired and stored. After the ROI has been defined, and the first image has been acquired, at steps 154, 155 the image is analyzed and a suitable overlap region is selected based on the content of the emission itself. One wants to make sure that there is enough emission and feature(s) inside the overlap region that the cross correlation (or other) technique can easily match neighboring images. At step 156 the size of the overlap is then used for calculating the position at which the next image is acquired and the translation stage is moved by the calculated amount. This will continue until the entire ROI has been covered by acquisition, as represented by step 157; and, a represented by steps 158, 159, the final large image may be constructed from the individual acquisitions.

Consider for example the case when the ith image has been acquired and the system has to decide where to move the stage for the (i+1)th image. In this example, the (i+1)th image will be on the right hand side of the ith image. After the ith image has been acquired and before the stage is moved, the right hand side of the ith image is analyzed and a suitable overlap is calculated based on the intensity and feature(s) of the emission in that region. In one embodiment, a minimum amount of emission has to be obtained and the overlap amount is chosen to be the minimum value from the right hand side of the image that guarantees such emission level. In another embodiment, feature(s) (e.g. emission peaks) with a certain amplitude relative to the background have to be obtained. In this case, the overlap region is chosen to be the minimum value that guarantees that those peaks are included in the overlap region. In another embodiment, a combination of methods may be used to define the minimum overlapping region. In some, or preferably all cases, a maximum overlap value may be imposed to avoid making the stage movements too small. Also a certain margin may be added to the calculated overlap to make sure that, due to non idealities in the stage movement (drifts, thermal effects), the desired feature is also visible in the (i+1)th image. Once the overlap value has been calculated, the stage is moved by an amount equal to FOV-OL. The (i+1)th image is acquired and the process proceeds to the next image until the entire ROI has been covered.

Exemplary System and Article of Manufacture Details

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

One or more embodiments of the invention, or elements thereof, can be implemented in the form of an apparatus including a memory and at least one processor that is coupled to the memory and operative to perform exemplary method steps.

Figure 8:
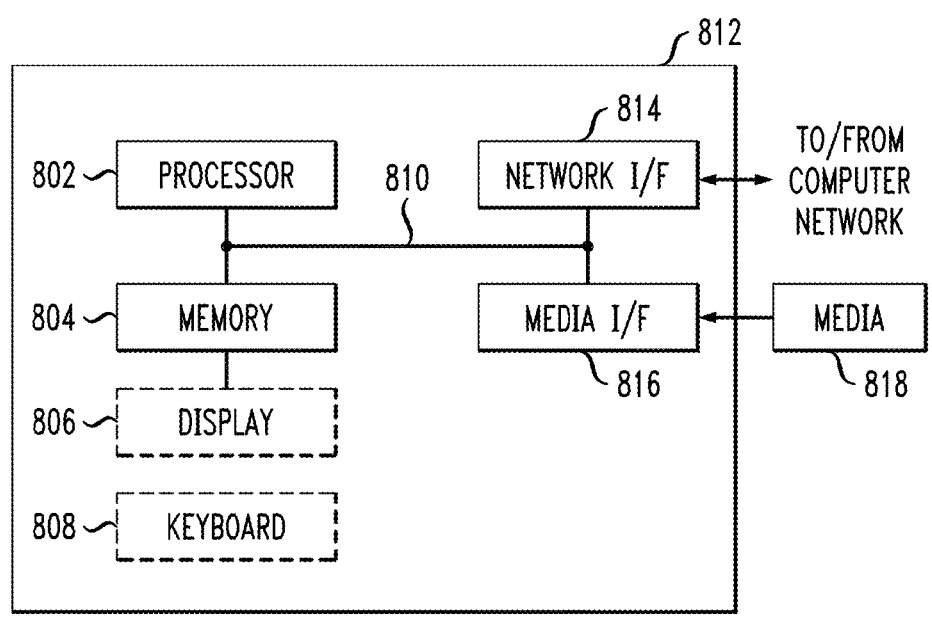
FIG. 8 depicts a computer system that may be useful in implementing one or more aspects and/or elements of the invention.

One or more embodiments can make use of software running on a general purpose computer or workstation. With reference to FIG. 8, such an implementation might employ, for example, a processor 802, a memory 804, and an input/output interface formed, for example, by a display 806 and a keyboard 808. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, one or more mechanisms for inputting data to the processing unit (for example, mouse), and one or more mechanisms for providing results associated with the processing unit (for example, printer). The processor 802, memory 804, and input/output interface such as display 806 and keyboard 808 can be interconnected, for example, via bus 810 as part of a data processing unit 812. Suitable interconnections, for example via bus 810, can also be provided to a network interface 814, such as a network card, which can be provided to interface with a computer network, and to a media interface 816, such as a diskette or CD-ROM drive, which can be provided to interface with media 818.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 802 coupled directly or indirectly to memory elements 804 through a system bus 810. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including but not limited to keyboards 808, displays 806, pointing devices, and the like) can be coupled to the system either directly (such as via bus 810) or through intervening I/O controllers (omitted for clarity).

Network adapters such as network interface 814 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 812 as shown in FIG. 8) running a server program. It will be understood that such a physical server may or may not include a display and keyboard.

As noted, aspects of the present invention may take the form of a computer program product embodied in one or more computer readable medium(s) having computer readable program code embodied thereon. Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. Media block 818 is a non-limiting example. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should be noted that any of the methods described herein can include an additional step of providing a system comprising distinct software modules embodied on a computer readable storage medium; the modules can include, for example, a distinct software module for emission prediction and a distinct software module for image processing. The distinct software module for emission prediction might have a first sub-module for calculating Iddq, another for summing Iddq values within a tile, another for oversampling, and another for calculating the emissions based on the Iddq values, for example. The method steps can then be carried out using the distinct software modules and/or sub-modules of the system, as described above, executing on one or more hardware processors 802. Further, a computer program product can include a computer-readable storage medium with code adapted to be implemented to carry out one or more method steps described herein, including the provision of the system with the distinct software modules and/or sub-modules.

In any case, it should be understood that the components illustrated herein may be implemented in various forms of hardware, software, or combinations thereof; for example, application specific integrated circuit(s) (ASICS), functional circuitry, one or more appropriately programmed general purpose digital computers with associated memory, and the like. Given the teachings of the invention provided herein, one of ordinary skill in the related art will be able to contemplate other implementations of the components of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method comprising:
obtaining a light emission map of a circuit to be tested for alterations;
obtaining a light emission map of a reference circuit; and
comparing an image of said light emission map of said circuit to be tested with an image of said light emission map of said reference circuit, to determine presence of said alterations;
wherein said comparing step comprises at least one of performing image processing to subtract the image of said light emission map of said circuit to be tested from the image of said light emission map of said reference circuit, performing image processing to differentiate the image of said light emission map of said circuit to be tested from the image of said light emission map of said reference circuit, and performing image processing to apply a two-dimensional correlation function to correlate the image of said light emission map of said circuit to be tested and the image of said light emission map of said reference circuit;
wherein said light emission map of said reference circuit is obtained by simulation;
wherein said simulation comprises:
calculating a leakage current for each of a plurality of devices of said reference circuit, based on a layout database and a state vector;
dividing said reference circuit into a plurality of sub-Nyquist tiles;
summing said leakage current for each of said devices in each given one of said sub-Nyquist tiles to obtain a resultant grid; and
oversampling said resultant grid, wherein said oversampling comprises convolving an oversampling window with said sub-Nyquist tiles to provide smoothing; and
wherein said step of obtaining said light emission map of said circuit to be tested, said step of obtaining said light emission map of said reference circuit, and said step of comparing are performed by one or more hardware devices including a memory and at least one processor, coupled to said memory.

2. The method of claim 1, further comprising normalizing at least one of the image of said light emission map of said circuit to be tested and the image of said light emission map of said reference circuit, prior to said comparing step.

3. The method of claim 2, wherein said light emission map of said circuit to be tested is obtained by an emission tool.

4. The method of claim 3, further comprising applying liquid cooling to said circuit to be tested while obtaining said light emission map.

5. The method of claim 3, further comprising initializing said circuit to be tested prior to said obtaining of said light emission map of said circuit to be tested.

6. The method of claim 1, wherein said simulation further comprises:
applying a functional form to obtain said light emission map from said leakage currents in said resultant grid.

7. The method of claim 6, wherein said functional form is based on data gathered using a calibration circuit.

8. The method of claim 2, wherein said light emission map of said circuit to be tested is obtained using a microscope with an objective lens.

9. The method of claim 8, further comprising introducing a solid immersion lens between said objective lens of said microscope and said circuit to be tested.

10. The method of claim 2, wherein said alterations comprise tampering with unused logic.

11. The method of claim 10, wherein said unused logic comprises unused gate arrays.

12. An apparatus comprising:
means for obtaining a light emission map of a circuit to be tested for alterations;
means for obtaining a light emission map of a reference circuit; and
means for comparing an image of said light emission map of said circuit to be tested with an image of said light emission map of said reference circuit, to determine presence of said alterations;
wherein said means for comparing comprises at least one of means for performing image processing to subtract the image of said light emission map of said circuit to be tested from the image of said light emission map of said reference circuit, means for performing image processing to differentiate the image of said light emission map of said circuit to be tested from the image of said light emission map of said reference circuit, and means for performing image processing to apply a two-dimensional correlation function to correlate the image of said light emission map of said circuit to be tested and the image of said light emission map of said reference circuit;
wherein said means for obtaining said light emission map of said reference circuit comprises:
means for calculating a leakage current for each of a plurality of devices of said reference circuit, based on a layout database and a state vector;
means for dividing said reference circuit into a plurality of sub-Nyquist tiles;
means for summing said leakage current for each of said devices in each given one of said sub-Nyquist tiles to obtain a resultant grid; and
means for oversampling said resultant grid, wherein said oversampling comprises convolving an oversampling window with said sub-Nyquist tiles to provide smoothing.

13. The apparatus of claim 12, further comprising means for normalizing at least one of the image of said light emission map of said circuit to be tested and the image of said light emission map of said reference circuit, prior to said comparing step.

14. An apparatus comprising:
a memory;
at least one processor, coupled to said memory, said processor being operative to:
obtain a light emission map of a circuit to be tested for alterations;
obtain a light emission map of a reference circuit;
compare an image of said light emission map of said circuit to be tested with an image of said light emission map of said reference circuit, to determine presence of said alterations; and at least one of perform image processing to subtract the image of said light emission map of said circuit to be tested from the image of said light emission map of said reference circuit, perform image processing to differentiate the image of said light emission map of said circuit to be tested from the image of said light emission map of said reference circuit, and perform image processing to apply a two-dimensional correlation function to correlate the image of said light emission map of said circuit to be tested and the image of said light emission map of said reference circuit; and an emission prediction module embodied in a computer readable storage medium, said at least one processor being operative to execute said emission prediction module to obtain said light emission map of said reference circuit;

wherein said processor is operative to execute said emission prediction module by:

calculating a leakage current for each of a plurality of devices of said reference circuit, based on a layout database and a state vector;

dividing said reference circuit into a plurality of sub-Nyquist tiles;

summing said leakage current for each of said devices in each given one of said sub-Nyquist tiles to obtain a resultant grid; and oversampling said resultant grid, wherein said oversampling comprises convolving an oversampling window with said sub-Nyquist tiles to provide smoothing.

15. The apparatus of claim 14, wherein said at least one processor is further operative to normalize at least one of the image of said light emission map of said circuit to be tested and the image of said light emission map of said reference circuit, prior to said comparing step.

16. The apparatus of claim 15, wherein said processor is further operative to execute said emission prediction module by:

applying a functional form to obtain said light emission map from said leakage currents in said resultant grid.

17. A computer program product comprising a non-transitory computer readable recordable storage medium including computer usable program code, the computer program product including:

computer usable program code for obtaining a light emission map of a circuit to be tested for alterations;

computer usable program code for obtaining a light emission map of a reference circuit; and computer usable program code for comparing an image of said light emission map of said circuit to be tested with an image of said light emission map of said reference circuit, to determine presence of said alterations; and computer usable program code for at least one of performing image processing to subtract the image of said light emission map of said circuit to be tested from the image of said light emission map of said reference circuit, performing image processing to differentiate the image of said light emission map of said circuit to be tested from the image of said light emission map of said reference circuit, and performing image processing to apply a two-dimensional correlation function to correlate the image of said light emission map of said circuit to be tested and the image of said light emission map of said reference circuit;

wherein said computer usable program code for obtaining said light emission map of said reference circuit comprises:

computer usable program code for calculating a leakage current for each of a plurality of devices of said reference circuit, based on a layout database and a state vector;

computer usable program code for dividing said reference circuit into a plurality of sub-Nyquist tiles;

computer usable program code for summing said leakage current for each of said devices in each given one of said sub-Nyquist tiles to obtain a resultant grid; and computer usable program code for oversampling said resultant grid, wherein said oversampling comprises convolving an oversampling window with said sub-Nyquist tiles to provide smoothing.

18. The computer program product of claim 17, further comprising computer usable program code for normalizing at least one of the image of said light emission map of said circuit to be tested and the image of said light emission map of said reference circuit, prior to said comparing step.

19. The method of claim 1, further comprising generating a light emission map of a difference between the image of said light emission map of said circuit to be tested and the image of said light emission map of said reference circuit.

\* \* \* \* \*